(12) United States Patent
Cho

(10) Patent No.: US 9,097,845 B2
(45) Date of Patent: Aug. 4, 2015

(54) OPTOELECTRONIC CHIPS INCLUDING COUPLER REGION AND METHODS OF MANUFACTURING THE SAME

(71) Applicant: Samsung Electronics Co., Ltd., Suwon-Si, Gyeonggi-Do (KR)

(72) Inventor: Seong-ho Cho, Gwacheon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 13/768,204

(22) Filed: Feb. 15, 2013

(65) Prior Publication Data

US 2013/0163919 A1 Jun. 27, 2013

Related U.S. Application Data

(63) Continuation-in-part of application No. 13/474,809, filed on May 18, 2012.

(30) Foreign Application Priority Data

Nov. 2, 2011 (KR) .................. 10-2011-0113581
Nov. 2, 2012 (KR) .................. 10-2012-0123755

(51) Int. Cl.
*G02B 6/12* (2006.01)
*H01L 21/82* (2006.01)
*G02B 6/134* (2006.01)

(52) U.S. Cl.
CPC ............. *G02B 6/12* (2013.01); *G02B 6/1347* (2013.01); *H01L 21/82* (2013.01); *G02B 2006/12104* (2013.01)

(58) Field of Classification Search
CPC .... G02B 6/12004; G02B 6/4214; G02B 6/43; G02B 2006/121; G02B 2006/12104; G02B 6/122; G02B 6/132; G02B 6/136; G02B 6/3512; G02B 6/12; G02B 6/1347; G06F 1/105; H01S 3/08059; H05K 1/0274
USPC ...................................... 385/14, 130
See application file for complete search history.

(56) References Cited

U.S. PATENT DOCUMENTS 4,529,267 A * 7/1985 Nishioka et al. .............. 385/117
5,562,838 A * 10/1996 Wojnarowski et al. ......... 216/24

(Continued)

FOREIGN PATENT DOCUMENTS

JP    2002286958 A    10/2002
JP    2003167141 A    6/2003

(Continued)

OTHER PUBLICATIONS

U.S. Office Action dated Oct. 9, 2013, issued in U.S. Appl. No. 13/474,809.

(Continued)

*Primary Examiner* — Peter Radkowski
(74) *Attorney, Agent, or Firm* — Harness, Dickey & Pierce, P.L.C.

(57) ABSTRACT

An optoelectronic chip, and/or a method of manufacturing the same, include a substrate; a coupler region surrounded by the substrate. The coupler region includes a total reflection surface. The total reflection surface is configured to totally reflect a first light incident through a surface of the substrate such that the reflected first light travels within the substrate, or the total reflection surface is configured to totally reflect a second light guided in the substrate and incident on the total reflecting surface such that the reflected second light travels through the surface of the substrate.

2 Claims, 14 Drawing Sheets

(56) References Cited

U.S. PATENT DOCUMENTS

| | | | |
|---|---|---|---|
| 5,882,468 A * | 3/1999 | Crockett et al. | 156/345.3 |
| 6,351,576 B1 * | 2/2002 | Ding | 385/14 |
| 7,001,788 B2 * | 2/2006 | Leon et al. | 438/31 |
| 2002/0057862 A1 * | 5/2002 | Okayama | 385/17 |
| 2004/0114860 A1 * | 6/2004 | Dultz et al. | 385/31 |
| 2004/0136065 A1 * | 7/2004 | Yoon et al. | 359/455 |
| 2004/0190826 A1 * | 9/2004 | Ghiron et al. | 385/36 |
| 2004/0208438 A1 * | 10/2004 | Faris | 385/31 |
| 2005/0054130 A1 * | 3/2005 | Leon et al. | 438/31 |
| 2005/0070036 A1 * | 3/2005 | Geusic et al. | 438/29 |
| 2006/0017991 A1 * | 1/2006 | Poulsen | 359/20 |
| 2006/0023990 A1 * | 2/2006 | Shih et al. | 385/14 |
| 2006/0104566 A1 * | 5/2006 | Bakir et al. | 385/14 |
| 2006/0118897 A1 * | 6/2006 | Jouan et al. | 257/432 |
| 2007/0217004 A1 * | 9/2007 | Smith et al. | 359/456 |
| 2008/0031583 A1 * | 2/2008 | Ohtsu et al. | 385/130 |
| 2009/0256224 A1 * | 10/2009 | Coudrain et al. | 257/432 |
| 2010/0142885 A1 * | 6/2010 | Shinoda et al. | 385/14 |
| 2010/0142896 A1 * | 6/2010 | Riester et al. | 385/88 |

FOREIGN PATENT DOCUMENTS

| | | |
|---|---|---|
| KR | 20090064952 A | 6/2009 |
| KR | 20110024098 A | 3/2011 |

OTHER PUBLICATIONS

Kobler, Johannes, "Thin Films from Porous Nanoparticles," Dissertation, Munich, 2008.

Office Action for corresponding U.S. Appl. No. 13/474,809 dated May 8, 2014.

Chung, et al., "Silicon-photonics light source realized by III-V/Si-grating-mirror laser," *Applied Physics Letters*, vol. 97, pp. 151113-1-151113-3 (2010).

Zheng, et al., "Optical proximity communication using reflective mirrors," *Optics Express*, vol. 16, No. 19, pp. 15052-15058 (Sep. 15, 2008).

* cited by examiner

OPTOELECTRONIC CHIPS INCLUDING COUPLER REGION AND METHODS OF MANUFACTURING THE SAME

CROSS-REFERENCE TO RELATED APPLICATIONS

This U.S. non-provisional patent application is a continuation-in part of, and claims the benefit of priority under 35 U.S.C. §120 to, U.S. application Ser. No. 13/474,809, filed May 18, 2012, which claims the benefit of Korean Patent Application No. 10-2011-0113581, filed on Nov. 2, 2011, and also claims the benefit of priority under 35 U.S.C. §119(e) from Korean Patent Application No. 10-2012-0123755, filed on Nov. 2, 2012, in the Korean Intellectual Property Office, the disclosure of each of which is incorporated herein by reference in its entirety.

BACKGROUND

1. Field

Example embodiments relate to optoelectronic chips and/or methods of manufacturing the same.

2. Description of the Related Art

Semiconductor integrated circuits (ICs) perform electrical communication by electrically transmitting and receiving data therebetween. Semiconductor ICs are integrated on a printed circuit board (PCB), and perform electrical communication via wires. There is a limitation in reducing electrical resistance between semiconductor ICs. Also, electrical communication may be affected by external magnetic waves. Accordingly, it is difficult to increase a transmission speed between semiconductor integrated circuits.

Optical interconnection, or optical communication, has recently been used in order to increase a transmission speed between semiconductor ICs. This is because if a signal exchanged between devices changes to an optical signal, there is little interference from external electromagnetic waves, and therefore high-speed communication is possible.

Couplers are widely used as devices configured for optical interconnection or optical communication between optical devices, between an optical device and an electronic device, or between semiconductor ICs. Various attempts have been made to reduce the loss of light and improve coupling efficiency.

Diffraction grating couplers, which are commonly used, need a technology for guaranteeing an exact grating period and have low optical coupling efficiency.

SUMMARY

Example embodiments relate to optoelectronic chips and/or methods of manufacturing the same.

In an example embodiment, there are provided optoelectronic chips including coupler regions.

In another example embodiment, there are provided methods of manufacturing the same.

According to an example embodiment, an optoelectronic chip includes a coupler region surrounded by a substrate. The coupler region includes a total reflection surface. The total reflection surface is configured to totally reflect a first light incident through a surface of the substrate such that the reflected first light travels within the substrate, or the total reflection surface is configured to totally reflect a second light guided in the substrate and incident on the total reflecting surface such that the reflected second light travels through the surface of the substrate.

The coupler region may include a metal material.

The substrate may be a silicon-on-insulator (SOI) substrate including a buried oxide layer.

The coupler region may be on the buried oxide layer.

The coupler region may include silicon oxide.

According to another example embodiment, a method of manufacturing an optoelectronic chip includes forming a coupler region having a total reflection surface in a substrate.

The coupler region may be formed of a material having a refractive index lower than a refractive index of the substrate.

The forming may include forming a mask layer having an opening on the substrate; implanting ions at an angle inclined with respect to a surface of the substrate into the substrate through the opening; and removing the mask layer and annealing.

The angle may correspond to an angle at which the total reflection surface of the coupler region to be manufactured is inclined with respect to the surface of the substrate.

The implanting may implant at least one portion of the ions at a different ion implantation energy than a remaining portion of the ions.

The implanting may include forming a first low refractive index region in the substrate by implanting a first group of the ions with a first ion implantation energy; and forming a second low refractive index region at a depth different from a depth of the first low refractive index region in the substrate by implanting a second group of the ions with a second ion implantation energy different from the first ion implantation energy.

Due to the annealing, the ions implanted into the first low refractive index region and the second low refractive index region may be diffused between the first low refractive index region and the second low refractive index region to form the coupler region.

The substrate may be a silicon-on-insulator (SOI) substrate including a buried oxide layer.

The forming may include etching a part of the substrate such that a groove including an inclined surface is formed in the substrate by using the buried oxide layer as an etch stop layer; and forming the total reflection surface by coating a first material on the inclined surface of the groove.

The first material may be a material having a refractive index lower than a refractive index of the substrate.

The first material may include silicon oxide or silicon nitride.

The method may further include filling a remaining part of the groove with a second material having a refractive index higher than the refractive index of the first material.

The second material may include polysilicon (poly-Si) or amorphous silicon (a-Si).

The first material may be a metal material.

The method may further include filling a remaining part of the groove with a material including poly-Si or a-Si.

BRIEF DESCRIPTION OF THE DRAWINGS

Example embodiments will be more clearly understood from the following detailed description taken in conjunction with the accompanying drawings. FIGS. 1-14G represent non-limiting, example embodiments as described herein.

FIG. 1 is a cross-sectional view illustrating an optoelectronic chip according to an example embodiment;

FIG. 3 is a cross-sectional view illustrating an optoelectronic chip according to another example embodiment;

FIG. 4 is a numerical simulation graph illustrating the coupling efficiency of a coupler region included in the optoelectronic chip of FIG. 3;

FIG. 5 is a cross-sectional view illustrating an optoelectronic chip according to yet another example embodiment;

FIG. 6 is a numerical simulation graph illustrating the coupling efficiency of a coupler region included in the optoelectronic chip of FIG. 5;

FIG. 7 is a cross-sectional view illustrating an optoelectronic chip according to a further example embodiment;

FIG. 8 is a cross-sectional view illustrating a coupling path according to a tolerance regarding an angle of light incident on a coupler region included in the optoelectronic chip of FIG. 7;

FIGS. 14A through 14G are cross-sectional views for explaining a method of manufacturing an optoelectronic chip, according to still yet another example embodiment.

DETAILED DESCRIPTION

Figure 1:
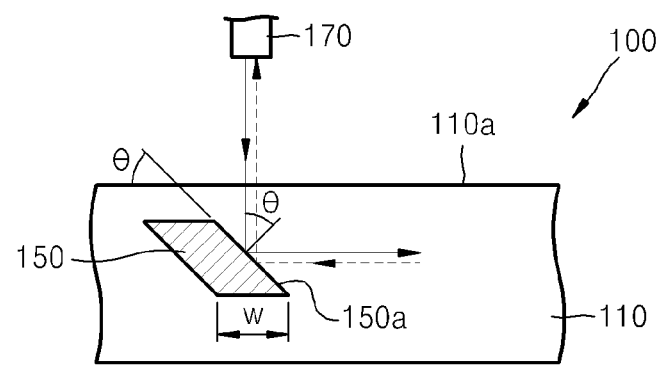

Various example embodiments will now be described more fully with reference to the accompanying drawings in which some example embodiments are shown. However, specific structural and functional details disclosed herein are merely representative for purposes of describing example embodiments. Thus, features may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Example embodiments relate to optoelectronic chips and/or methods of manufacturing the same.

FIG. 1 is a cross-sectional view illustrating an optoelectronic chip according to an example embodiment.

Referring to FIG. 1, an optoelectronic chip 100 includes a substrate 110 and a coupler region 150 embedded in (or, surrounded by) the substrate 110. The optoelectronic chip 100 including a plurality of optical devices or electronic devices includes the coupler region 150 for coupling optical signals between the optical devices or electronic devices. The plurality of optical devices or electronic devices may be disposed on the substrate 110, may be disposed in the substrate 110, or may be disposed above the substrate 110 to be spaced apart from the substrate 110. In FIG. 1, the coupler region 150 of the optoelectronic chip 100 is mainly illustrated. The optoelectronic chip 100 may further include an optical fiber 170 that transmits light to the coupler region 150 through a surface 110a of the substrate 110 or transmits light emitted from the surface 110a of the substrate 110 through the coupler region 150 to an external device.

The substrate 110 may be formed of a material such as silicon, GaAs, InP, or a conductive polymer, for example.

The coupler region 150 has a total reflection surface 150a that totally reflects light incident through the surface 110a of the substrate 110 into the substrate 110 or emits light guided in the substrate 110 through the surface 110a of the substrate 110. That is, the total reflection surface 150a is configured to totally reflect a first light incident through a surface 110a of the substrate 110 such that the reflected first light travels within the substrate 110, and/or the total reflection surface 150a is configured to totally reflect a second light guided in the substrate 110 and incident on the total reflecting surface 150a such that the reflected second light travels through the surface 110a of the substrate 110.

The coupler region 150 is formed of a material having a refractive index lower than a refractive index of the substrate 110, or a metal material. Assuming that the coupler region 150 is formed of a material having a refractive index lower than a refractive index of the substrate 110, if the optoelectronic chip 100 is configured such that light is vertically incident on the surface 110a of the substrate 110, an angle θ between the totally reflective surface 150a and the surface 110a of the substrate 110 has to be greater than a critical angle for total reflection ($\sin^{-1}(n_2/n_1)$) by considering a relationship between a refractive index, $n_1$, of the substrate 110 and a refractive index, $n_2$, of the coupler region 150. If the substrate 110 is a silicon substrate, the coupler region 150 may be formed of silicon oxide.

The coupler region 150 is not limited to a shape shown in FIG. 1. The coupler region 150 may have any shape so long as the coupler region 150 has the total reflection surface 150a. A width, w, of the coupler region 150 may be appropriately determined by considering coupling efficiency, and may be, for example, about 0.5 μm or more.

Figure 2A:
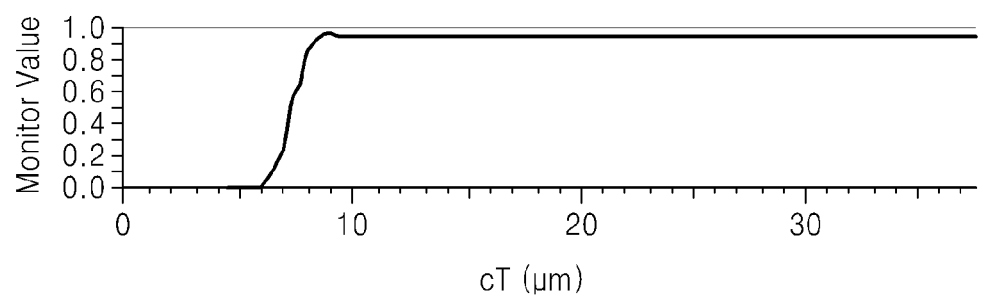
FIGS. 2A and 2B are numerical simulation graphs illustrating coupling efficiency when a width of a coupler region included in the optoelectronic chip of FIG. 1 is 2 μm and 0.5 μm, respectively.
Figure 2B:
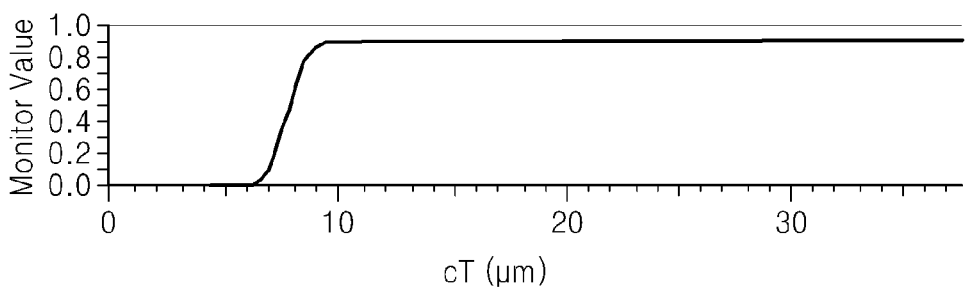

FIGS. 2A and 2B are numerical simulation graphs illustrating coupling efficiency when the width, w, of the coupler region included in the optoelectronic chip of FIG. 1 is 2 μm and 0.5 μm, respectively.

Coupling efficiency refers to a ratio of the amount of light horizontally coupled to the total amount of light vertically incident on the surface of the substrate. A horizontal axis of each graph represents a distance in a direction parallel to the surface of the substrate inside the substrate.

Referring to FIG. 2A, when the width w of the coupler region 150 is 2 μm, and the coupling efficiency is almost 100%.

Referring to FIG. 2B, when the width w of the coupler region 150 is 0.5 μm, and the coupling efficiency is equal to or higher than 90%.

Figure 3:
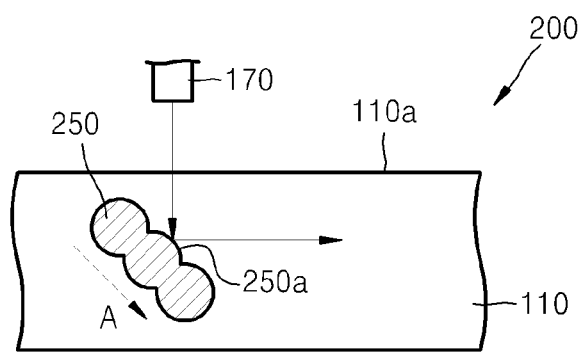
Figure 4:
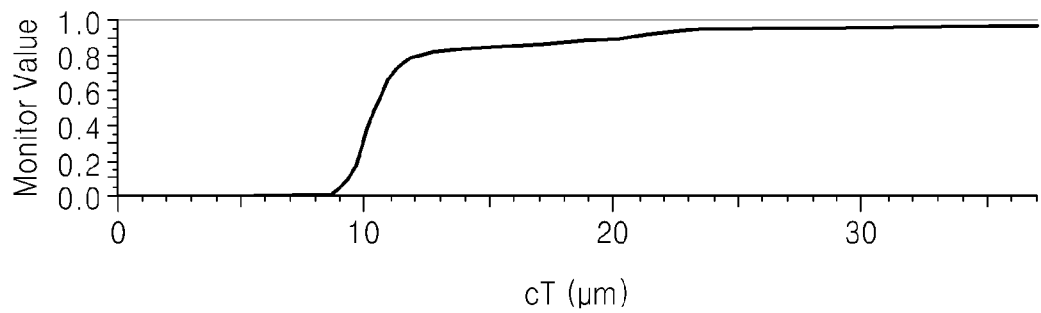

FIG. 3 is a cross-sectional view illustrating an optoelectronic chip according to another example embodiment. FIG. 4 is a numerical simulation graph illustrating the coupling efficiency of a coupler region included in the optoelectronic chip of FIG. 3.

Referring to FIG. 3, an optoelectronic chip 200 is different from the optoelectronic chip shown in FIG. 1 in terms of a shape of a coupler region 250. The coupler region 250 may have a cylindrical shape, and a cylindrical surface may be a total reflection surface 250a. The coupler region 250 may be formed such that a plurality of cylindrical shapes partially overlap with one another in an A direction inclined at a desired (or, alternatively, predetermined) angle with respect to the surface 250a of the substrate 110. The plurality of cylindrical surfaces are connected to collectively form the total reflection surface 250a.

Referring to FIG. 4, the coupling efficiency of the optoelectronic chip 200 is almost 100%.

Figure 5:
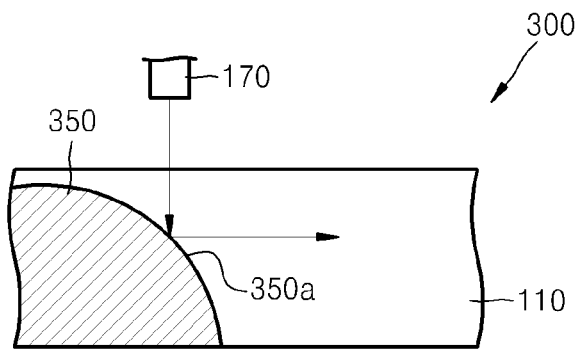
Figure 6:
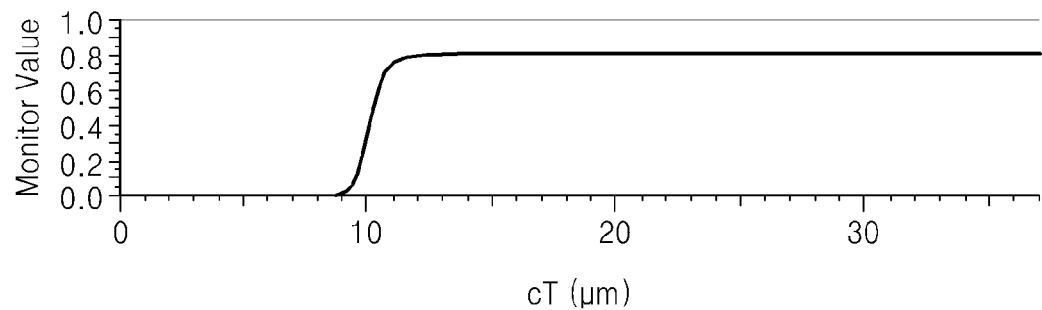

FIG. 5 is a cross-sectional view illustrating an optoelectronic chip according to yet another example embodiment. FIG. 6 is a numerical simulation graph illustrating the coupling efficiency of a coupler region included in the optoelectronic chip of FIG. 5.

Referring to FIG. 5, an optoelectronic chip 300 includes a coupler region 350 having a spherical shape. A spherical surface is a total reflection surface 350a. The coupling efficiency is about 80%.

Figure 7:
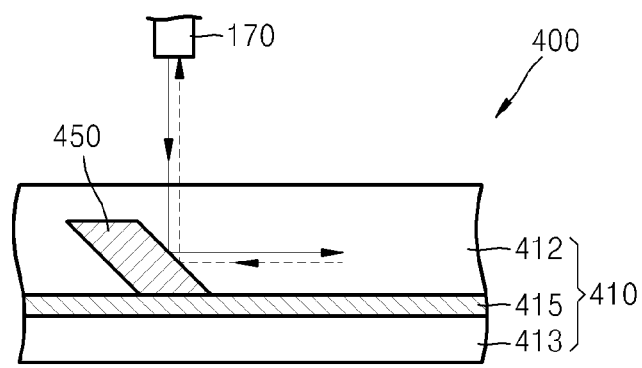
Figure 8:
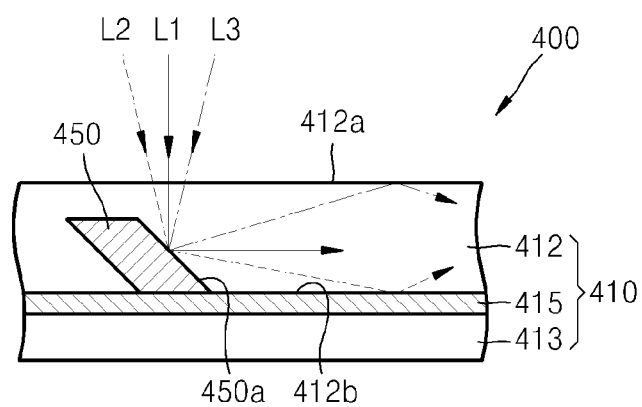

FIG. 7 is a cross-sectional view illustrating an optoelectronic chip according to a further example embodiment. FIG. 8 illustrates a coupling path according to a tolerance regarding an angle of light incident on a coupler region included in the optoelectronic chip of FIG. 7.

Referring to FIG. 7, an optoelectronic chip 400 is configured such that a coupler region 450 is formed in a silicon-on-insulator (SOI) substrate 410 including a buried oxide layer 415. The coupler region 450 may be formed on the buried oxide layer 415, and may be formed of silicon oxide. Silicon layers 412 and 413 are disposed over and under the buried oxide layer 415, respectively. Also, if the silicon layer 412 is formed of silicon (Si), the coupler region 450 may be formed of amorphous silicon (a-Si) or poly silicon (poly-Si).

The SOI substrate 410, which is commonly used to form a semiconductor integrated circuit (IC), an optical IC, or an optoelectronic IC, may be formed by using separation by implantation of oxygen (SIMOX).

Referring to FIG. 8, because the coupler region 450 is a low refractive index region and the buried oxide layer 415 is also a low refractive index region compared to the silicon layer 412, both surfaces 412a and 412b of the silicon layer 412 become total reflection surfaces. Thus, the silicon layer 412 acts (or, functions) as a waveguide for guiding light. An angle of a total reflection surface 450a of the coupler region 450 is designed based on light L1 vertically incident on a surface of the SOI substrate 410. Even when light L2 and light L3 which are tilted to some extent are incident, the coupled light is guided into the SOI substrate 410. Although the description is given assuming that incident light is tilted, even when the total reflection surface 450a is somewhat different from a designed one, the coupled light may be guided using the same principle.

Although the coupler region 450 of FIG. 7 has the same shape as that of the coupler region 150 of FIG. 1, the coupler region 250 or 350 as shown in FIG. 3 or 5 may be formed on the buried oxide layer 415 of the SOI substrate 410.

FIGS. 9A through 9H are cross-sectional views for explaining a method of manufacturing an optoelectronic chip, according to an example embodiment.

The optoelectronic chip manufactured by the method includes a coupler region that is formed in a substrate and is formed of a material having a refractive index lower than that of the substrate. The method includes preparing the substrate and forming the coupler region in the substrate, wherein the coupler region is formed of a material having a refractive index lower than that of the substrate.

In order to form the coupler region, a pattern layer having a shape corresponding to a shape of the coupler region is formed on the substrate.

A method of forming the pattern layer is illustrated in FIGS. 9A through 9D.

Figure 9A:
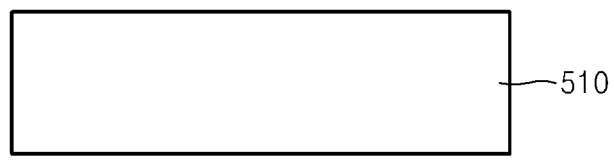
FIGS. 9A through 9H are cross-sectional views for explaining a method of manufacturing an optoelectronic chip, according to an example embodiment.

Referring to FIG. 9A, a substrate 510 is prepared. The substrate 510 may be formed of a material such as silicon, GaAs, InP, or a conductive polymer.

Figure 9B:
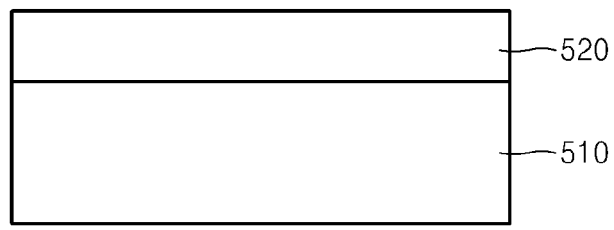

Referring to FIG. 9B, a pattern material layer 520 is coated on the substrate 510. The pattern material layer 520 may be formed of a material that can be reflowed by heat, for example, a photoresist.

Figure 9C:
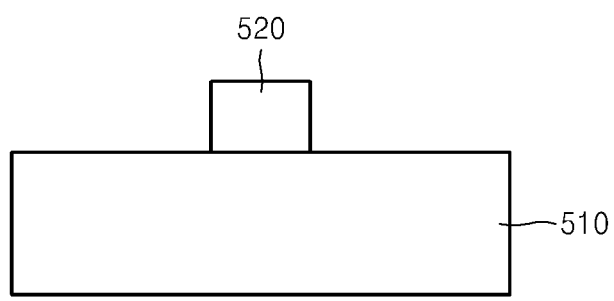
Figure 9D:
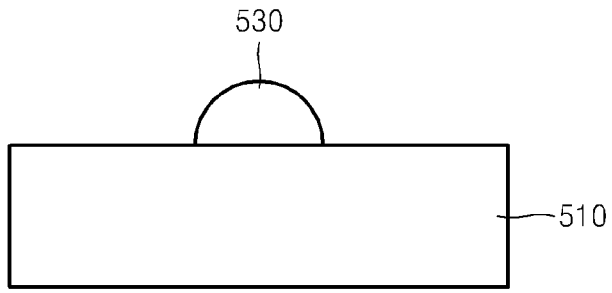

Referring to FIG. 9C, the pattern material layer 520 is patterned to have a width corresponding to the width of a pattern layer 530 shown in FIG. 9D.

Referring to FIG. 9D, a thermal reflow process is performed on the pattern material layer 520 patterned to have the desired (or, alternatively, predetermined) width and the pattern layer 530 is formed. The pattern layer 530 may have a semi-spherical shape or a semi-cylindrical shape but the present example embodiment is not limited thereto.

Figure 9E:
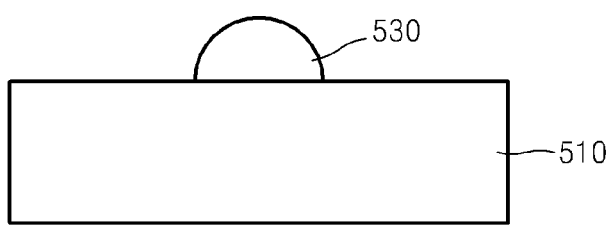

Referring to FIG. 9E, ions are implanted into the substrate 510 through the pattern layer 530.

Figure 9F:
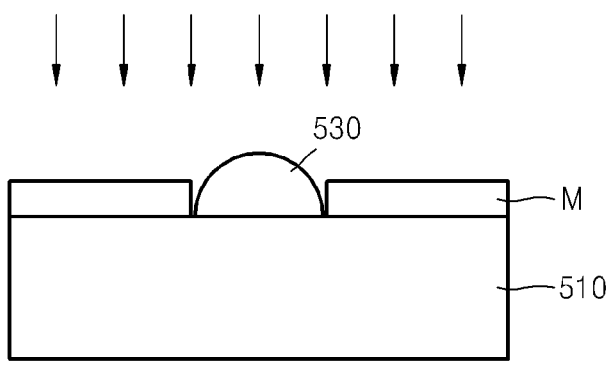

Referring to FIG. 9F, the ions may be implanted by using a mask M in which only a region corresponding to the pattern layer 530 is opened (or, exposed).

Figure 9G:
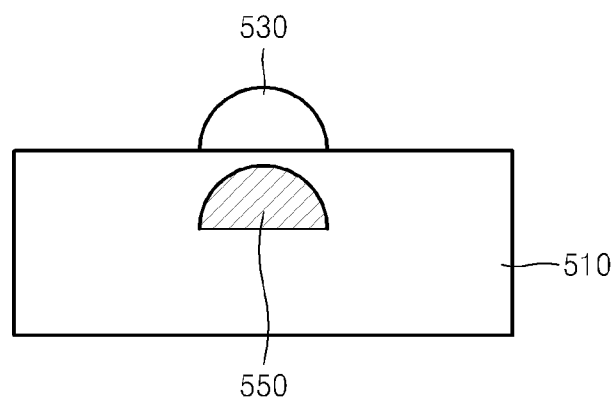

Referring to FIG. 9G, a coupler region 550 is formed. The coupler region 550 has a refractive index lower than a refractive index of the substrate 510. For example, if the substrate 510 is formed of silicon, the coupler region 550 formed of silicon oxide may be formed by implanting oxygen ions. The substrate 510 may be an SOI substrate including a buried oxide layer. In this case, the coupler region 550 formed of silicon oxide may be formed on the buried oxide layer.

Figure 9H:
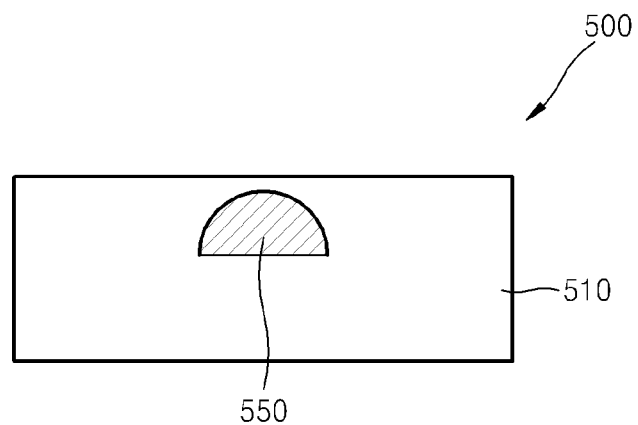

Referring to FIG. 9H, the pattern layer 530 is removed and annealing is performed on the substrate 510 including the coupler region 550 to realize an optoelectronic chip 500 including the coupler region 550.

Although the coupler region 550 in FIGS. 9A through 9H is manufactured to have one semi-spherical shape or semi-cylindrical shape, the coupler region 550 including a plurality of semi-spherical or semi-cylindrical shapes may be formed in the substrate 510 by repeatedly performing operations of FIGS. 9B through 9G by changing a position of the pattern layer 530 after an operation of FIG. 9H.

Although ion implantation is performed by using the pattern layer 530 having a shape corresponding to a shape of the coupler region 550 in FIGS. 9A through 9H, the shape of the coupler region 550 may be adjusted by appropriately adjusting ion implantation conditions (e.g., implantation angle, energy, and dose) without using the pattern layer 530.

FIGS. 10A through 10G are cross-sectional views for explaining an optoelectronic chip, according to another example embodiment.

Figure 10A:
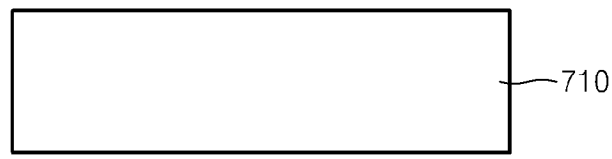
FIGS. 10A through 10G are cross-sectional views for explaining a method of manufacturing an optoelectronic chip, according to another example embodiment.

Referring to FIG. 10A, a substrate 710 may be a silicon substrate or an SOI substrate.

Figure 10B:
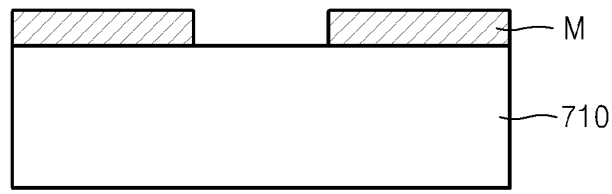

Referring to FIG. 10B, a mask layer M having an opening with a desired (or, alternatively, predetermined) size is formed on the substrate 710.

Figure 10C:
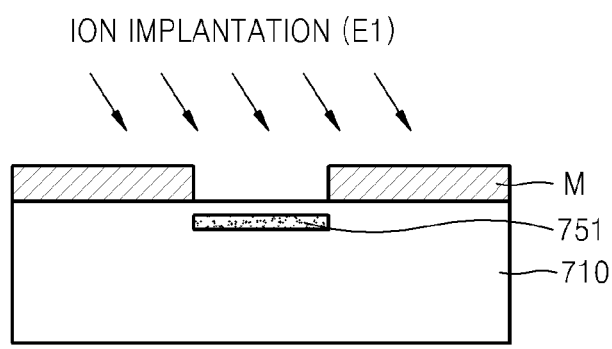

Referring to FIG. 10C, ions are implanted into the substrate 710 through the opening. A region into which the ions are implanted becomes a first low refractive index region 751 having a refractive index lower than that of other regions. For example, when the substrate 710 is formed of silicon, the first low refractive index region 751 formed of silicon oxide may be formed by implanting oxygen ions.

In FIG. 10C, the ions are implanted at an angle with respect to a surface of the substrate 710. The angle corresponds to an angle at which a total reflection surface 750a of a coupler region 750 to be formed in the substrate 710 is inclined. The angle at which the total reflection surface 750a is inclined with respect to the surface of the substrate 710 may be adjusted by adjusting the angle at which the ions are implanted. Also, because a depth to which the ions are implanted into the substrate 710 may be adjusted by adjusting ion implantation energy, the ion implantation energy may be appropriately determined in consideration of the depth.

The implanting of the ions may be repeatedly performed two or more times by changing the ion implantation energy. For example, the first low refractive index region 751 is formed at a desired (or, alternatively, predetermined) depth in the substrate 710.

Figure 10D:
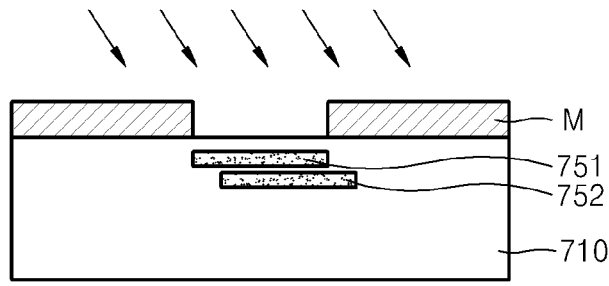
Figure 10E:
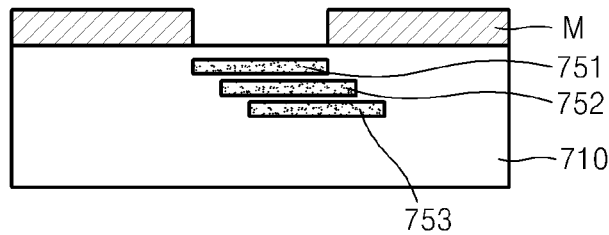

Referring to FIG. 10D, a second low refractive index region 752 is formed at a depth different from the depth of the first low refractive index region 751 by implanting ions with second energy E2 different from first energy E1. When the operation is repeatedly performed, referring to FIG. 10E, the first low refractive index region 751, the second low refractive index region 752, and a third low refractive index region 753 may be formed at different depths in the substrate 710. Although three low refractive index regions are illustrated in FIG. 10E, the present example embodiment is not limited thereto.

Figure 10F:
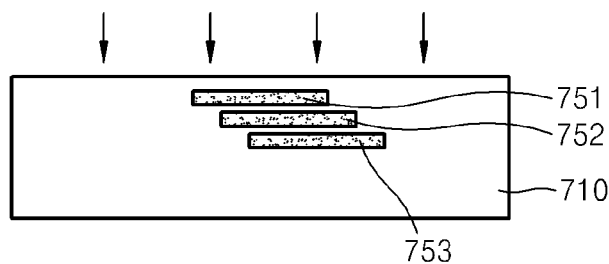
Figure 10G:
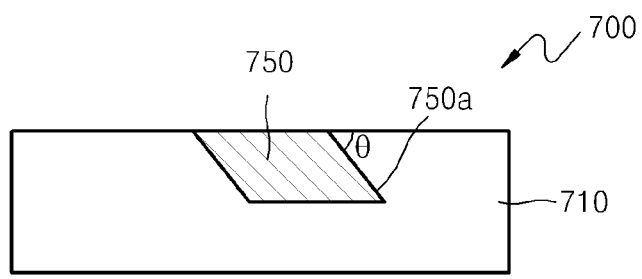

Referring to FIG. 10F, the mask layer M is removed, and annealing is performed. Due to the annealing, the ions implanted into the first low refractive index region 751, the second low refractive index region 752, and the third low refractive index region 753 are diffused between the first refractive index region 751 and the second low refractive index region 752 and between the second low refractive index region 752 and the third low refractive index region 753, thereby forming the coupler region 750 as shown in FIG. 10G.

The coupler region 750 has the total reflection surface 750a that is inclined at an angle θ with respect to the surface of the substrate 710. The angle θ may be adjusted according to the angle at which the ions are implanted during the operation of FIG. 10C.

FIGS. 11A through 11D are cross-sectional views for explaining a method of manufacturing an optoelectronic chip, according to yet another example embodiment.

In order to form a coupler region, the method includes etching a part of a substrate, and filling the etched part with a material having a refractive index lower than a refractive index of the substrate.

Figure 11A:
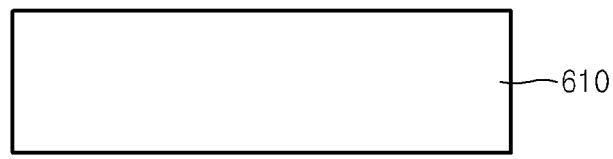
FIGS. 11A through 11D are cross-sectional views for explaining a method of manufacturing an optoelectronic chip, according to yet another example embodiment.

Referring to FIG. 11A, a substrate 610 is prepared. The substrate 610 may be an SOI substrate, or may be formed of a material such as silicon, GaAs, InP, or a conductive polymer.

Figure 11B:
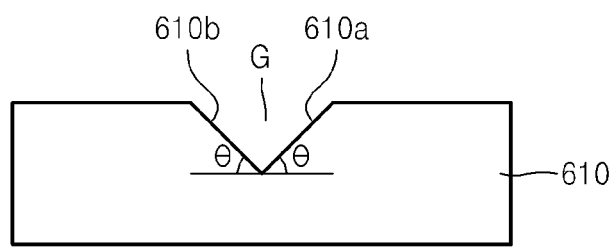

Referring to FIG. 11B, a groove G is formed by etching a part of the substrate 610. If the substrate 610 is formed of silicon (Si), the groove G, which has an inverted pyramid shape and including inclined surfaces 610a and 610b that are inclined at an angle θ, is formed by wet etching. The angle θ is about 54.7°. One of the inclined surfaces 610a and 610b is used as a total reflection surface of a coupler region 650.

Figure 11C:
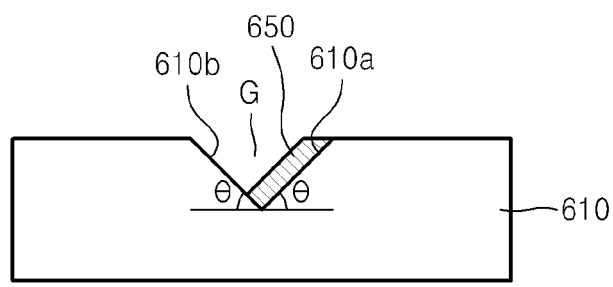

Referring to FIG. 11C, a coupler region 650 may be formed by coating a first material having a refractive index lower than a refractive index of the substrate 610 on the inclined surface 610a to fill in a part of the groove G. The coupler region 650 may have a thickness of about 100 nm to 1 μm. The first material may be silicon oxide or silicon nitride.

Figure 11D:
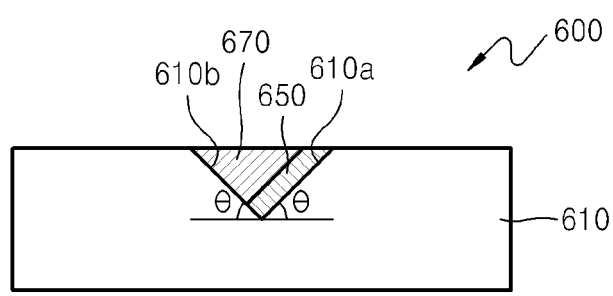

Referring to FIG. 11D, a remaining part of the groove G is filled with a second material 670. The second material 670 has a refractive index higher than the refractive index of the first material of the coupler region 650. For example, the second material 670 may be a material similar or identical to the material of the substrate 610. The substrate 610 may be formed of Si, and the second material 670 may be formed of silicon-crystalline Si, a-Si, or poly-Si.

FIGS. 12A through 12D are cross-sectional views for explaining a method of manufacturing an optoelectronic chip, according to still another example embodiment.

Like reference numerals are used for elements substantially identical to elements of FIGS. 11A through 11D, and thus, detailed descriptions thereof will not be repeated.

Figure 12A:
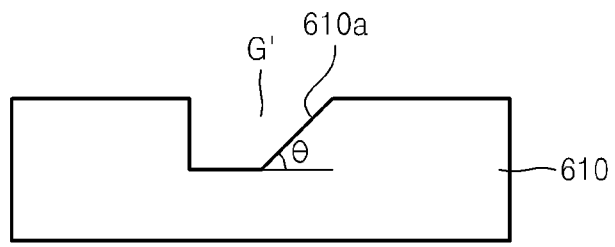
FIGS. 12A through 12C are cross-sectional views for explaining a method of manufacturing an optoelectronic chip, according to still another example embodiment.

Referring to FIG. 12A, the inclined surface 610b may be further etched by using dry etching to form a groove G'.

Figure 12B:
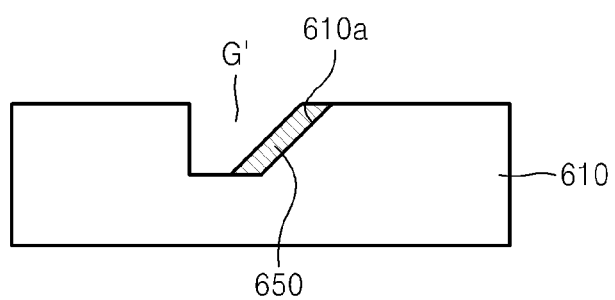

Referring to FIG. 12B, the coupler region 650 may be formed by coating the first material (e.g., silicon oxide or silicon nitride) having a refractive index lower than a refractive index of the substrate 610 on the inclined surface 610a to fill in a part of the groove G'.

Figure 12C:
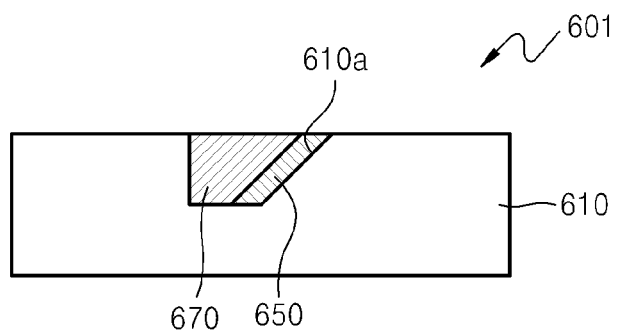

Referring to FIG. 12C, a remaining part of the groove G' is filled with the second material 670. The second material 670 has a refractive index higher than the refractive index of the first material of the coupler region 650. For example, the second material 670 may be a material similar, or identical to, the material of the substrate 610. The substrate 610 may be formed of Si, and the second material 670 may be formed of single-crystalline Si, a-Si, or poly-Si.

The optoelectronic chips 600 and 601 may be manufactured to have a similar shape to that of FIG. 7 by forming the coupler region 650 on a buried oxide layer using an SOI substrate as the substrate 610.

FIGS. 13A through 13G are cross-sectional views for explaining a method of manufacturing an optoelectronic chip, according to a further example embodiment.

Figure 13A:
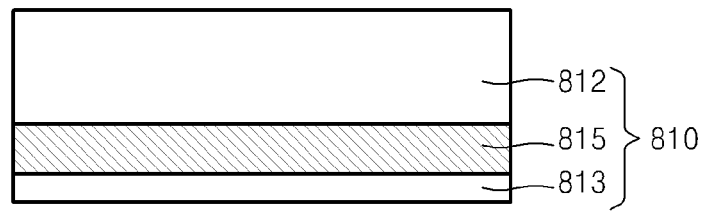
FIGS. 13A through 13G are cross-sectional views for explaining a method of manufacturing an optoelectronic chip, according to a further example embodiment.

Referring to FIG. 13A, a substrate 810 is prepared. The substrate 810 may be an SOI substrate including a buried oxide layer 815 formed between silicon layers 812 and 813.

Figure 13B:
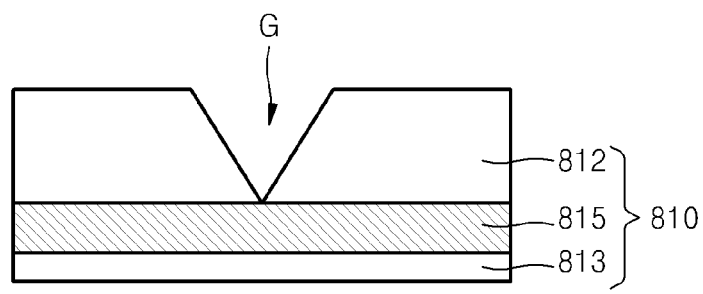

Referring to FIG. 13B, a groove G may be formed by etching the substrate 810, and the buried oxide layer 815 may function as an etch stop layer. The groove G may be formed by using wet etching, and an etchant may be potassium hydroxide (KOH) or tetramethylammonium hydroxide (TMAH). Due to the wet etching, the groove G has an inclined surface that is inclined at a set (or, alternatively, predetermined) angle according to a crystal direction of the silicon layer 812. For example, when the silicon layer 812 is formed of Si(100), an angle θ of the inclined surface is about 54.7°.

Figure 13C:
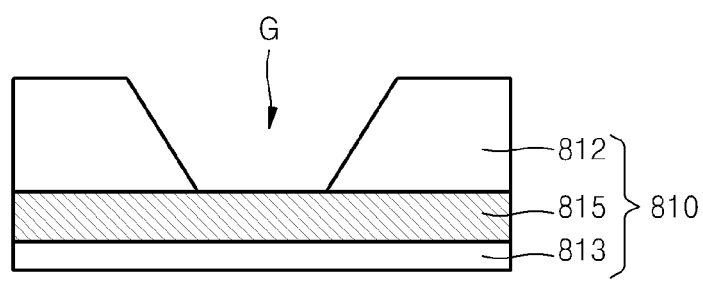

The groove G formed in the substrate 810 may have such a shape as shown in FIG. 13B, or such a shape as shown in FIG. 13C. The following explanation will be made on the assumption that the groove G has such a shape as shown in FIG. 13C.

A material for forming a total reflection surface 850a is coated on a side surface of the groove G, which will be explained in detail.

Figure 13D:
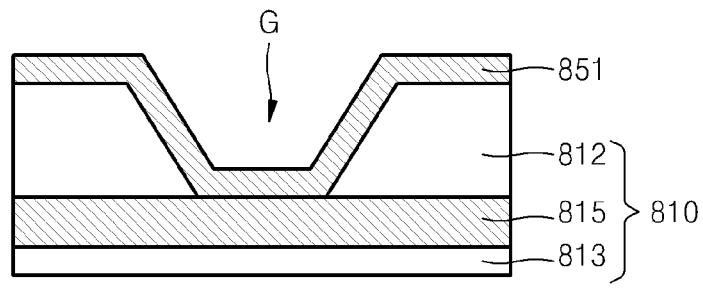

Referring to FIG. 13D, a first material 851 is coated along an inner surface of the groove G and a top surface of the substrate 810. The first material 851 may be a material having a refractive index lower than that of the substrate 810. For example, the first material 851 may be silicon oxide or silicon nitride.

Figure 13E:
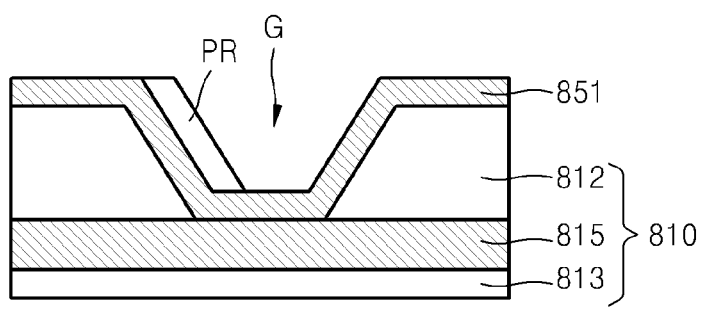
Figure 13F:
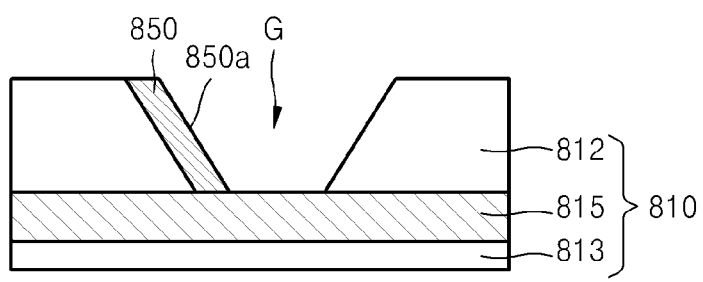

Referring to FIG. 13E, a photoresist layer PR is formed on the first material 851 on one side surface of the groove G. The photoresist layer PR may be formed over an entire surface of the first material 851 and then may be patterned as shown in FIG. 13E. When the first material 851 is etched by using the photoresist layer PR as a mask and then the photoresist layer PR is removed, a coupler region 850 as shown in FIG. 13F is formed.

Figure 13G:
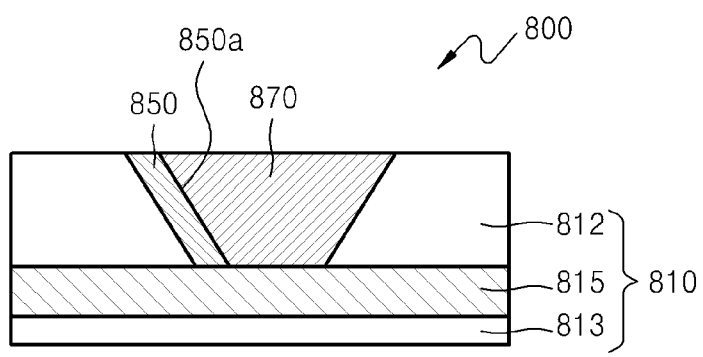

Referring to FIG. 13G, a remaining part of the groove G may be filled with a second material 870. The second material 870 may be a material having a refractive index higher than a refractive index of the first material 851, and may be, for example, poly-Si or a-Si.

Accordingly, an optoelectronic chip 800 including the coupler region 850 having the total reflection surface 850a that totally internally reflect light due to a difference in refractive index is manufactured.

FIGS. 14A through 14G are cross-sectional views for explaining a method of manufacturing an optoelectronic chip, according to a still another example embodiment.

Figure 14A:
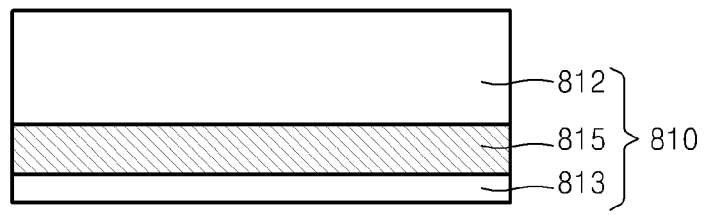
Figure 14B:
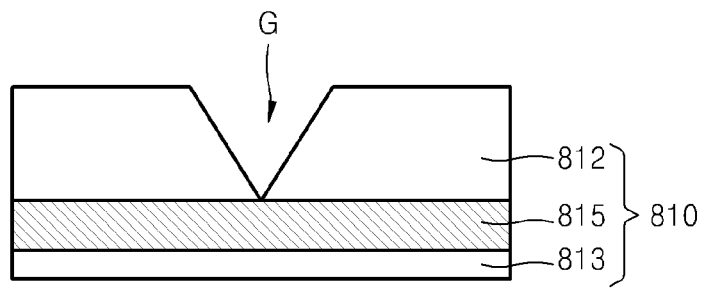
Figure 14C:
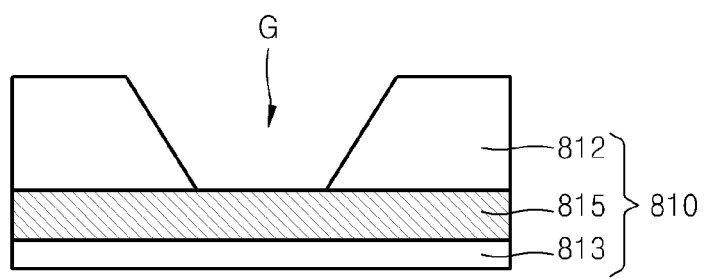

Referring to FIGS. 14A through 14C, the groove G is formed in the substrate 810. The substrate 810 may be an SOI substrate including the buried oxide layer 815 disposed between the silicon layers 812 and 813. As the buried oxide layer 815 functions as an etch stop layer, the groove G may be formed over the buried oxide layer 815.

Figure 14D:
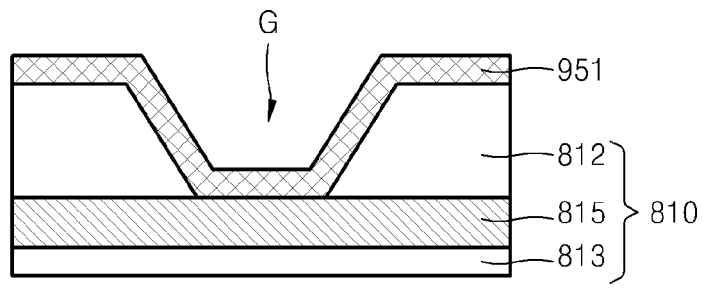

Referring to FIG. 14D, a metal layer 951 is formed along an inner surface of the groove G and a top surface of the substrate 810. The metal layer 951 for forming a total reflection surface 950a may be formed of, for example, silver (Ag), copper (Cu), or aluminum (Al).

Figure 14E:
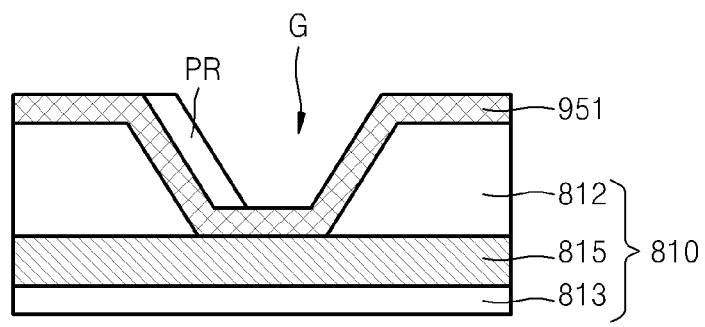
Figure 14F:
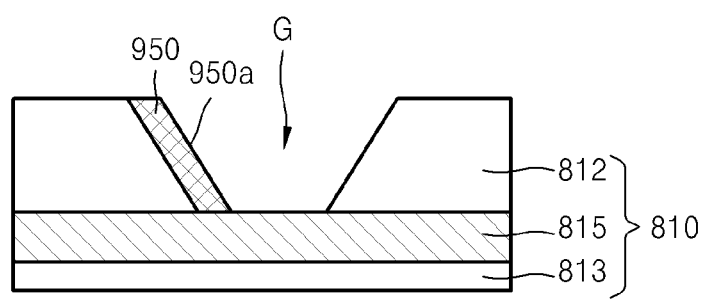

Referring to FIG. 14E, when the photoresist layer PR is patterned on the metal layer 951 on one side surface in the groove G, the metal layer 951 is etched by using the photoresist layer PR as a mask, and the photoresist layer PR is removed, a coupler region 950 as shown in FIG. 14F is formed.

Figure 14G:
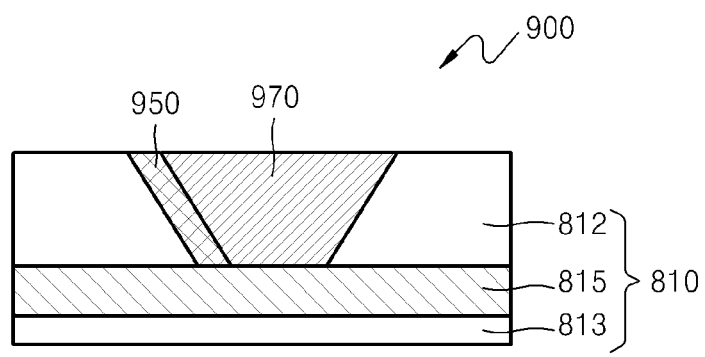

Referring to FIG. 14G, a second material 970 may be filled in a remaining part of the groove G. The second material 970 may be, for example, poly-Si or a-Si.

Accordingly, an optoelectronic chip 900 including the coupler region 950 having the total reflection surface 950a formed of a metal material is manufactured.

Although the substrate 810 in FIGS. 13A through 14G is an SOI substrate for the purpose of explaining that a buried oxide layer buried in the SOI substrate may be used as an etch stop layer, the substrate 810 may be any of other substrates.

Vertical coupling of incident light may be achieved by allowing a total reflection surface to be formed of a material having a refractive index lower than a refractive index of a substrate in the substrate to have high coupling efficiency.

The optoelectronic chip exhibits a stable coupling performance despite a manufacturing tolerance regarding an angle of a total reflection surface or a tolerance regarding an angle of incident light.

The method of manufacturing the optoelectronic chip may form a coupler region having a desired shape in a substrate by implanting ions by using a pattern layer corresponding to a shape of the coupler region. Also, the shape of the coupler region may be adjusted by using ion implantation conditions.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. An optoelectronic chip, comprising:
    a substrate including a first layer, a third layer and a second layer between the first layer and the third layer; and
    a coupler region formed of a metal material surrounded by the first layer,
    the first layer having a first surface and a second surface,
    the first surface being an interface with outside,
    the second surface being an interface with the second layer,
    the coupler region including a total reflection surface, and
    the total reflection surface being configured to totally reflect a first light incident through the first surface of the first layer such that the reflected first light travels within the first layer, or
    the total reflection surface being configured to totally reflect a second light guided in the first layer and incident on the total reflecting surface such that the reflected second light travels through the first surface of the first layer, and
    the coupler region being shaped in the form of a plurality of cylindrical shapes partially overlapping with one another in a direction inclined with respect to the first surface, and
    the plurality of cylindrical shapes collectively forming the total reflection surface.

2. The optoelectronic chip of claim 1, wherein the substrate is a silicon-on-insulator (SOI) substrate in which the first layer is an upper silicon layer, the third layer is a lower silicon layer, and the second layer is buried oxide layer between the upper silicon layer and the lower silicon layer.

* * * * *